United States Patent [19]

Canclini

[11] Patent Number: 5,341,005
[45] Date of Patent: Aug. 23, 1994

[54] STRUCTURE FOR PROTECTING AN INTEGRATED CIRCUIT FROM ELECTROSTATIC DISCHARGES

[75] Inventor: Athos Canclini, Como, Italy

[73] Assignee: SGS-Thomson Microelectronics S.r.l., Agrate Brianza, Italy

[21] Appl. No.: 941,520

[22] Filed: Sep. 8, 1992

[30] Foreign Application Priority Data

Sep. 12, 1991 [IT] Italy .................. VA91 A 0029

[51] Int. Cl.$^5$ .................. H01L 29/08; H01L 29/44
[52] U.S. Cl. .................. 257/173; 257/175; 257/603
[58] Field of Search .............. 257/173, 175, 176, 603, 257/605

[56] References Cited

FOREIGN PATENT DOCUMENTS 0264754 11/1986 Japan .
0224960 10/1987 Japan .

OTHER PUBLICATIONS

Goldthorp, D. C., Slutsky, E. B., "An Integrated Circuit Composite PNPN Diode." IEEE 1979, pp. 180–183.
Patent Abstracts of Japan, JP-A-62224960, vol. 12, No. 89, (E-592), 23 Mar. 1988.
Patent Abstracts of Japan, JP-A-61264754, vol. 11, No. 117, (E-498), 11 Apr. 1987.

Primary Examiner—Rolf Hille
Assistant Examiner—David B. Hardy
Attorney, Agent, or Firm—Wolf, Greenfield & Sacks

[57] ABSTRACT

An integrated protective structure provides protection from electrostatic discharges of structures to an integrated circuit functionally connected to a certain external pin. The protective structure is formed in a single epitaxial tub and includes a triggering Zener diode and a vertical bipolar transistor. The collector region of the vertical bipolar transistor is connected to the pin and constitutes also one of the two terminal regions of the triggering Zener. Around the emitter region and separated therefrom by the smallest distance feasible, is an annular region, having a heavier doping than the base region of the transistor formed with the purpose of intercepting the avalanche current of the Zener junction and distributing it in a uniform manner into the base region of the vertical transistor as well as acting as a shield for eventual electrons moving from the emitter region toward the breakdown junction. Optionally, a further emitter region, may be formed in front of the collector/cathode region and connected to the annular region in order to create a lateral bipolar transistor which triggers-on during an electrostatic discharge; thus, reducing the ohmic drop through the protective structure and the breakdown voltage.

14 Claims, 2 Drawing Sheets

STRUCTURE FOR PROTECTING AN INTEGRATED CIRCUIT FROM ELECTROSTATIC DISCHARGES

FIELD OF THE INVENTION

The present invention relates to an integrated structure for protecting from electrostatic discharges an integrated circuit which is electrically connected to device which may be hit by an electrostatic discharge, as a consequence of tribologic effects during handling. The structure may be realized in a single isolated epitaxial tub and includes a vertical bipolar transistor and a triggering Zener diode.

BACKGROUND OF THE INVENTION

When handling integrated circuits, electrostatic discharge currents, deriving from an eventual discharging of electrified bodies (e.g. the human body of operators, metal tools, packages, etc.), may hit external pins of integrated circuits. There are various standardized models for simulating these phenomena, such as the so-called "human body model" and "the charged device model."

In order to protect the integrated circuit, it is necessary to couple to an external pin, which may be hit by an electrostatic discharge, an integrated device or structure. This protecting device or structure protects the integrated devices or structures of the circuit which are connected to the particular external pin and are susceptible of destructive breakdown. The protecting structure must be as inconspicuous as possible during the normal functioning of the integrated circuit and must come into action by deriving across itself the discharge current whenever an electrostatic event, having a nonnegligeable level, occurs on the particular pin. Commonly, diodes or equivalent structures, capable of undergoing breakdown before the vulnerable structures of the integrated circuit connected to the pin breakdown, are connected between the pin to be protected and ground. The intrinsic disadvantage of Zener diodes, which are commonly used for this purpose, is that the discharge current tends to "concentrate" through the edge zone of the heavier diffusion of the junction undergoing breakdown because of the lower breakdown voltage exhibited by the curved zone of the junction. This current "concentration" effect causes a relatively large power dissipation within a restricted region of the semiconductor and an attendant localized overheating may lead to the melting of silicon and destruction of the protecting device. In some instances, the same pin may be connected through a second diode also to the supply rail, in order to distribute the discharge current over a larger number of junctions, which are normally connected to the supply rail. This offers more junctions to withstand the current. This second diode arrangement, however, may not be feasible in certain cases or may generate other problems.

SUMMARY OF THE INVENTION

Accordingly, a general object of the present invention is to provide a protective structure for protecting against electrostatic discharges (EDS) which structure, though being easy to implement, possibly, for example, in the form of a simple Zener junction having a relatively limited encumbrance, also has the ability of effectively limiting the above-discussed current concentration phenomena and its destructive consequences.

This object and other advantages are achieved by the integrated protection structure of the present invention. Basically the integrated structure of the invention utilizes a vertical bipolar transistor and a triggering Zener diode which may be both advantageously integrated in a single isolated epitaxial tub. The emitter region of the vertical transistor is surrounded by a shielding ring, constituted by an annular diffusion of the same type of conductivity as the base region of the transistor but having a heavier doping level then the latter. This annular shielding region intercepts the avalanche current of the Zener junction and distributes this avalanche current to the base of the transistor in a uniform manner, thus effectively preventing a dangerous concentration of current through restricted zones of the ground-connected emitter region of the transistor.

BRIEF DESCRIPTION OF THE DRAWINGS

The different features and related advantages of the protective structure of the invention will become more evident through a reading of the following description of several embodiments of the present invention, offered by way of example, and by reference to the annexed drawings, wherein.

DETAILED DESCRIPTION

The depicted examples pertain to the case of the protecting structure used in an integrated circuit formed having an n- type epitaxial layer grown on a p type substrate solely for illustrative and nonlimitating purposes. The protecting integrated structure of the invention may advantageously be used alternatively in integrated circuits formed having an epitaxial layer of an opposite type of conductivity by simply inverting all the polarities, as will be evident to a person skilled in the art.

Figure 1:
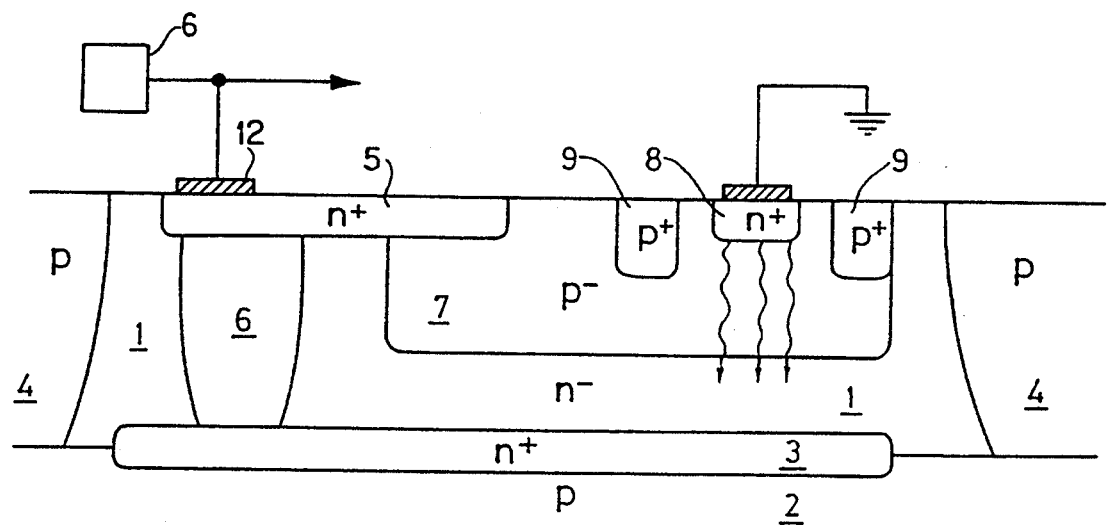
FIG. 1 is a schematic microsection of an integrated protection structure made in accordance with the present invention.

With reference to FIG. 1, a protective structure of the present invention is formed in an epitaxial region 1 of an n- type epitaxial layer grown on a p type substrate 2. The region 1 is defined at the bottom by an n+ type buried layer 3 and laterally by a p type isolation diffusion 4. A first n+ type region 5 or at least a portion thereof may be advantageously formed directly under a metallization layer 12 of a connection pad 6. Region 5 provides protection against ESD events of the integrated circuit. Alternatively, region 5 may be electrically connected to the metallization layer and the region 5 is also connected through a deep n+ (sinker) contact region 6 to the buried layer 3. The region 5 constitutes a first "terminal" of a triggering Zener diode of the protection structure. In the example depicted, the cathode region 5 of the diode acts also as a collector region of a bipolar vertical transistor, which, in the depicted example, is an NPN transistor, as will be described hereinbelow. A p- type region 7, which may have a diffusion profile as that of a p-well region, is entirely contained within the epitaxial tub and constitutes a second terminal region of the triggering Zener diode as well as a base region of the NPN vertical transistor. The emitter of the vertical NPN transistor is constituted by a second n+ type region 8 which is formed within the region 7 and is electrically connected to ground.

A p+ type annular region 9 entirely surrounds the emitter region 8 of the vertical NPN transistor and acts as a shield-distributor for the current injected into the base region during an electrostatic discharge having a sufficient intensity to bring into breakdown the Zener junction between the cathode region 5 and the anode region 7 of the triggering diode. Essentially, the annular region 9 has a higher doping level than the base region 7 and performs two functions. The first function is that of distributing in a more uniform manner, the current into the base region of the NPN vertical transistor in order to prevent a current concentration in restricted zones (curved zone) of the emitter junction. A second function is that of acting as a shield for an eventual flow of electrons which, from the emitter region 8, may be accelerated toward the junction between regions 5 and 7 when the latter goes into a breakdown condition.

It has been observed, in fact, that the impact-ionization action caused by these high kinetic energy electrons, the in absence of a p+ ring region 9, in turn causes a remarkable current leakage, also under relatively low voltage bias, and a lowering of the breakdown voltage of the structure.

Preferably, the separation distance between the annular region 9 and the emitter region 8 is as small as is permitted by the fabrication technology used for making the integrated circuit. The current which is distributed into the base region by the p+ ring 9 causes an injection of electrons from the emitter 8, which electrons are gathered by the n− epitaxial layer underlying the p− base region and thereafter by the n+ buried layer 3 which is highly conductive. This action complies with a typical operating scheme of an NPN vertical transistor.

It is important that the metal remain in contact with the region 5 of the cathode-collector region at a sufficient distance from the junction zone between the cathode region 5 and the anode region 7.

The structure of the invention offers the advantage of distributing the discharge current over the breakdown junction and the base-collector junction of the vertical NPN transistor. The discharge current flowing through the vertical transistor structure is less critical then the current flowing through the breakdown junction n+/p−. In fact, the current flowing through the breakdown junction concentrates on the extreme edge of the relatively thin n+ diffused region, while the current through the vertical structure distributes more uniformly over the entire base-collector junction area, underneath the emitter 8. This offers durability and longevity to the protecting structure.

A further advantage of the structure of the invention is due to the fact that the n+ cathode-collector region 5 is not entirely placed above the p− well region 7 partly so and partly above the n− epitaxial region 1. This advantage is as follows. If, during a particularly strong discharge, a vertical "spike" of aluminum of the pad metallization layer should form under the cathode contact, and even if the metal spike reaches the underlying n+ diffusion, there will not be any serious damage of the structure which will remain operative.

Figure 2:
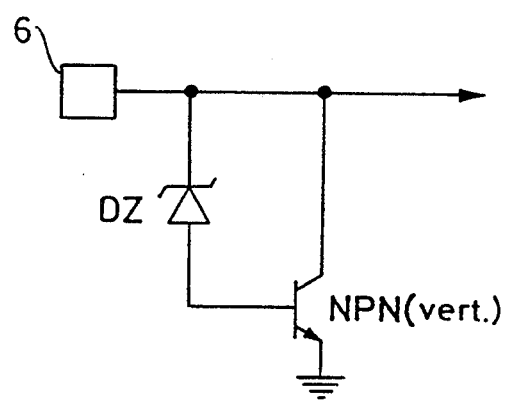
FIG. 2 is a functional electric diagram of the protection structure of the invention.

A functional circuit diagram of the protection structure of FIG. 1 is depicted in FIG. 2 and comprises a triggering Zener diode DZ and a vertical NPN transistor.

Figure 3:
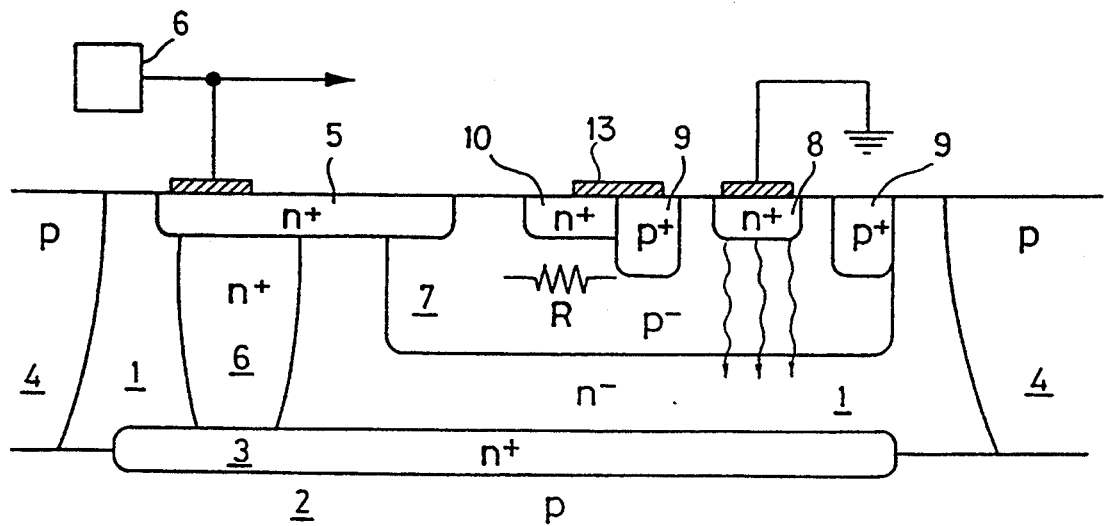
FIG. 3 is a schematic microsection of an alternative embodiment of an integrated protection structure of the invention.

According to an alternative embodiment of the integrated protection structure of the invention, as schematically depicted in FIG. 3, the series resistance of the protection structure may be reduced by forming a third n+ region 10 in front of the n+ cathode-collector region 5 and by connecting this additional region 10 to the annular p+ region 9 with a metal connector 13. This causes the triggering of a lateral NPN transistor during an electrostatic discharge, whose emitter is constituted by the additional n+ region 10 which is short-circuited to the p+ annular region 9.

During a discharge, the operation is the following. The current caused by the breakdown of the n+/p− Zener junction (regions 5 and 7, respectively), by flowing through the resistive path (R) within the p− layer 7 underlying the n+ region 10 creates a forward conduction of the edge portion of the junction between said n+ diffusion 10 and the p− region 7. Electrons injected into the p− base region migrate toward the n+ region 5 which acts as cathode-collector for such a lateral NPN transistor. This operation procures two advantageous effects:

1) a reduction of the breakdown voltage of the avalanche junction (between regions 5 and 7) because of the impact-ionization caused by electrons injected thereto; and 2) a current flow through the lateral NPN structure is no longer due only to a drift current but also to a diffusion current (electrons diffusing from the emitter to the collector); this achieves a lower ohmic drop through the lateral structure and, therefore, a reduction of the voltage which will be reached by the protected pin (6) during a discharge.

Figure 4:
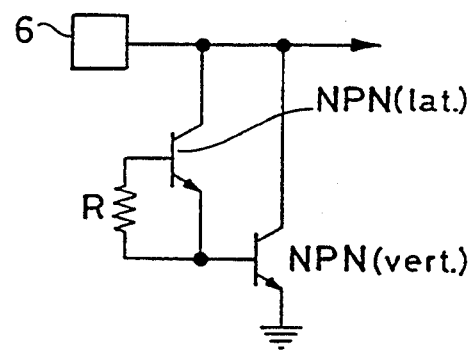
FIG. 4 is the functional electric diagram of the integrated structure of FIG. 3.

An equivalent electric circuit diagram of the integrated protective structure of FIG. 3 during an electrostatic discharge, in accordance with the operation described hereinabove, is shown in FIG. 4. As shown, the circuit includes a lateral NPN transistor and a vertical NPN transistor.

It is to be appreciated that the foregoing description is presented by way of example only and in no way is intended to be limiting. The scope of protection is defined by the appended claims and equivalents thereto.

What is claimed is:

1. An integrated protective structure for protecting an integrated circuit, functionally connected to a pin, from electrostatic discharges, the protective structure formed in a single epitaxial region of a first type of conductivity, the protective structure defined at a bottom side by a buried layer of the first type of conductivity and defined laterally by an isolation region of a second type of conductivity, the protective structure comprising:

a first region of the first type of conductivity electrically connected to the pin and coupled to the buried layer through a deep diffused contact region of the first type of conductivity, the first region constituting a first terminal of a Zener diode and a collector region of a vertical bipolar transistor, the Zener diode having an avalanche current and a breakdown voltage;

a well region of the second type of conductivity contained within the epitaxial region, the well region having a certain doping level, the well region constituting a second terminal of the Zener diode and a base region of the vertical transistor;

a second region of the first type of conductivity formed within the well region and connected to ground, the second region constituting an emitter region of the vertical transistor;

an annular region of the second type of conductivity formed within the well region, the annular region having a doping level higher than the certain doping level of the well region, the annular region surrounding the second region, the annular region intercepting the avalanche current of the Zener diode and distributing the avalanche current into the base region of the vertical transistor during an electrostatic discharge on the pin; and a third region of the first type of conductivity formed within the well region, the third region facing the first region and connected to the annular region, the third region constituting an emitter of a lateral bipolar transistor, a collector of which is constituted by the first region, the lateral transistor reduces the breakdown voltage of the Zener diode and an ohmic drop through the structure during an electrostatic discharge.

2. An integrated protective structure for protecting an integrated circuit, functionally connected to a pin, from electrostatic discharges, the protective structure comprising:

a first region of a first type conductivity electrically connected to the pin, the first region constituting a first terminal of a Zener diode and a collector region of a vertical bipolar transistor the Zener diode having an avalanche current and a breakdown voltage;

a well region of a second type of conductivity contained within an epitaxial region, the well region constituting a second terminal of a Zener diode and a base region of the vertical transistor, the well region having a certain doping level;

a second region of the first type of conductivity formed within the well region and coupled to ground, the second region constituting an emitter region of the vertical transistor;

an annular region of the second type of conductivity formed within the well region and surrounding the second region, the annular region intercepting the avalanche current of the Zener diode and distributing the avalanche current into the base region of the vertical transistor during an electrostatic discharge on the pin; and a third region of the first type of conductivity formed within the well region, the third region facing the first region and connected to the annular region, the third region consisting of an emitter of a lateral bipolar transistor, a collector of which is constituted by the first region, the lateral transistor reduces the breakdown voltage of the Zener diode and an ohmic drop through the structure during an electrostatic discharge.

3. A structure as recited in claim 2 wherein the protective structure is formed in a single epitaxial region of the first type of conductivity.

4. A structure as recited in claim 2 wherein the protective structure is defined at a bottom by a buried layer of the first type of conductivity.

5. A structure as recited in claim 2 wherein the first region is coupled to the buried layer through a deep diffused contact region of the first type of conductivity.

6. A structure as recited in claim 2 wherein the protective structure is laterally defined by an isolation region of the second type of conductivity.

7. A structure as recited in claim 2 wherein the annular region has a doping level higher than the certain doping level of the well region.

8. An integrated protective structure for protecting an integrated circuit, functionally connected to a pin, from electrostatic discharges, the protective structure formed in a single n− epitaxial region, the protective structure defined at a bottom by an n+ buried layer and laterally by a p isolation region, the structure comprising:

a first n+ region electrically connected to the pin and connected to the buried layer through an n+ deep diffused contact region, the first region constituting a cathode of a Zener diode and a collector of a vertical NPN transistor, the Zener diode having an avalanche current and a breakdown voltage;

a p− well region contained within the epitaxial region and constituting an anode of the Zener diode and a base of the vertical transistor, the well region having a certain doping level;

a second n+ region formed within the well region and connected to ground, the second region constituting an emitter of the vertical transistor;

an annular p+ region formed within the well region and having a higher doping level than the certain doping level of the well region, the annular region surrounding the second region, the annular region intercepting the avalanche current of the Zener diode and distributing the avalanche current into the base of the vertical transistor during an electrostatic discharge event; and a third n+ region formed within the well region in front of the first region and connected to the annular region, the third region constituting an emitter of a lateral NPN transistor, a collector of which is constituted by the first region, the lateral transistor reduces the breakdown voltage of the Zener diode and an ohmic drop through the structure during an electrostatic discharge.

9. An integrated protective structure for protecting an integrated circuit, functionally connected to a pin, from electrostatic discharges, the protective structure comprising:

a first n+ region electrically connected to the pin, the first region constituting a first terminal of a Zener diode and a collector of a vertical NPN transistor, the Zener diode having an avalanche current and a breakdown voltage;

a p− well region contained within an epitaxial region, the well region constituting a second terminal of the Zener diode and a base of the vertical transistor, the well region having a certain doping level;

a second n+ region formed within the well region and coupled to ground, the second region constituting an emitter of the vertical transistor;

an annular p+ region formed within the well region and surrounding the second region, the annular region intercepting the avalanche current of the zener diode and distributing the avalanche current into the base of the vertical transistor during an electrostatic discharge on the pin; and a third n+ region formed within the well region, the third region facing the first region and connected to the annular region, the third region constituting an emitter of a lateral bipolar transistor, a collector of which is constituted by the first region, the lateral transistor reduces the breakdown voltage of the Zener diode and an ohmic drop through the structure during an electrostatic discharge.

10. A structure as recited in claim 9 wherein the protective structure is formed in a single n− epitaxial region.

11. A structure as recited in claim 9 wherein the protective structure is defined at a bottom by an n+ buried layer.

12. A structure as recited in claim 11 wherein the first region is coupled to the buried layer through an n+ deep diffused contact region.

13. A structure as recited in claim 9 wherein the protective structure is laterally defined by a p isolation region.

14. A structure as recited in claim 9 wherein the annular region has a doping level higher than the certain doping level of the well region.

* * * * *